United States Patent [19]

Lindmayer

[11] 4,347,264

[45] Aug. 31, 1982

[54] METHOD OF APPLYING CONTACTS TO A SILICON WAFER AND PRODUCT FORMED THEREBY

[75] Inventor: Joseph Lindmayer, Bethesda, Md.

[73] Assignee: Solarex Corporation, Rockville, Md.

[21] Appl. No.: 915,288

[22] Filed: Jun. 13, 1978

Related U.S. Application Data

[62] Division of Ser. No. 614,618, Sep. 18, 1975, abandoned.

[51] Int. Cl.³ .................. B05D 5/12; F16L 55/10; H01L 31/00
[52] U.S. Cl. ......................... 430/314; 29/572; 148/189; 156/648; 357/30; 427/88; 428/199; 428/209; 428/210; 428/450; 428/433; 136/261
[58] Field of Search .............. 136/89 CC; 428/428, 428/209, 210, 433, 913, 450, 199; 427/88, 75; 148/189; 357/30; 156/648; 29/572

[56] References Cited

U.S. PATENT DOCUMENTS

| | | | |
|---|---|---|---|
| 3,361,594 | 1/1968 | Iles | 136/89 CC |
| 3,533,850 | 10/1970 | Tarneja | 136/89 CC |
| 3,653,970 | 4/1972 | Iles | 136/89 CC |
| 3,904,453 | 9/1975 | Revesz | 136/89 CC |
| 3,922,774 | 12/1975 | Lindmayer | 136/89 CC |
| 3,949,463 | 4/1976 | Lindmayer | 136/89 CC |
| 4,005,240 | 1/1977 | Schlacter | 136/89 CC |

*Primary Examiner*—Ellis P. Robinson
*Attorney, Agent, or Firm*—Watson, Cole, Grindle & Watson

[57] ABSTRACT

Metal contacts are deposited on a clean surface of a silicon wafer by coating the wafer with a glass during diffusion to form a junction inwardly of the surface, applying a photoresist layer to the glass, phtographing and developing a pattern for the contacts on the photoresist layer, etching out underlying portions of the glass layer, depositing the metal contacts in the voids so created, and then removing the entirety of the photoresist and glass layers.

2 Claims, 1 Drawing Figure

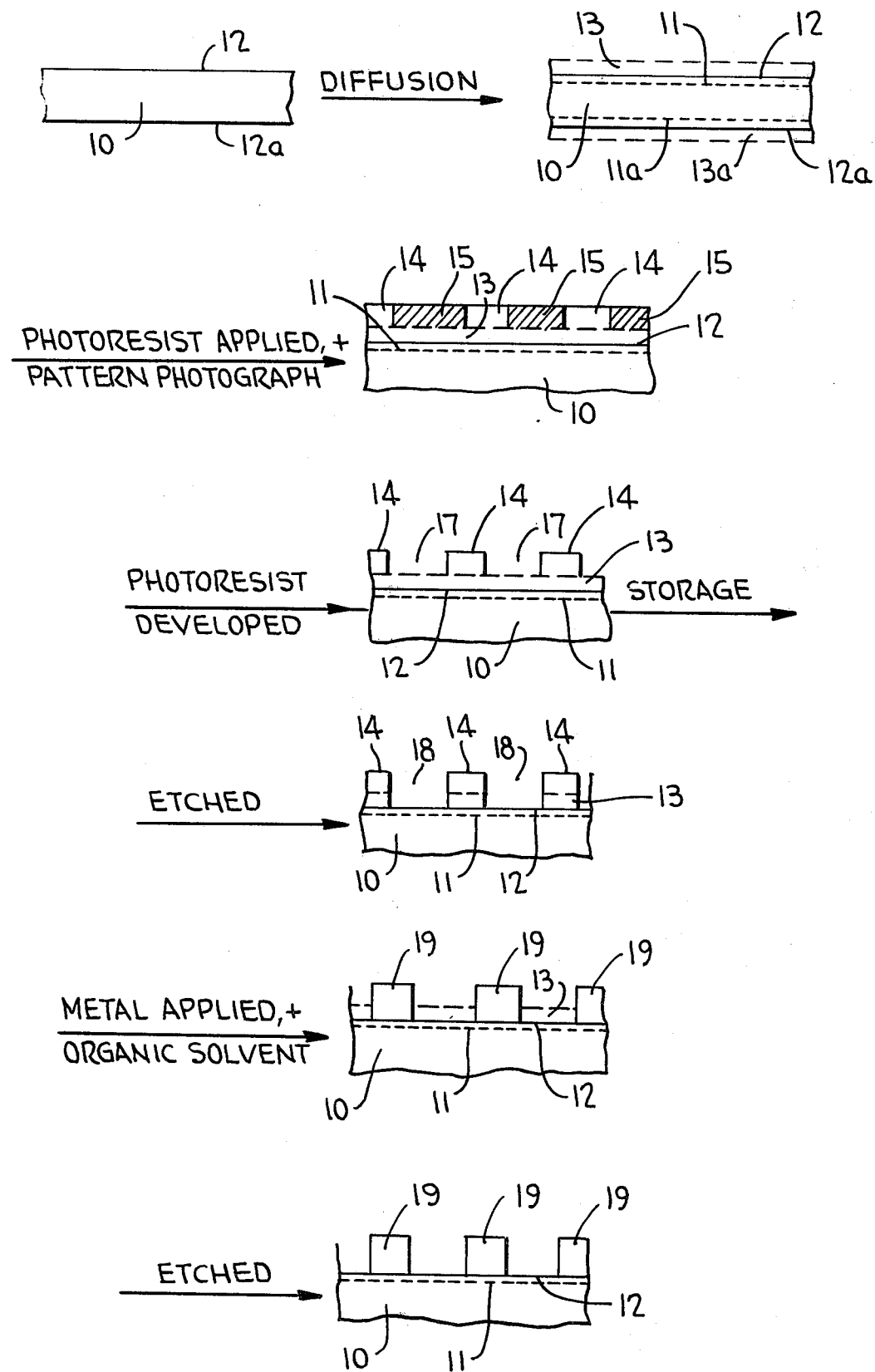

METHOD OF APPLYING CONTACTS TO A SILICON WAFER AND PRODUCT FORMED THEREBY

This is a division of application Ser. No. 614,618 filed Sept. 18, 1975 now abandoned.

This invention generally relates to the art of silicon solar energy cells and methods of forming those cells. More particularly, it is directed to a method of forming a contact on a wafer of silicon by depositing an electrically conductive material on the surface in a predetermined pattern, and to the silicon wafer produced thereby.

A problem that is present in the manufacture of silcon solar energy cells is to assure firm adherence of electrical contacts to the silicon wafer. The contacts, which usually are of an electrically conductive metal, may be deposited directly on the silicon surface by any of several methods, but to a large extent adherence to the surface will be dependent on the cleanliness of the surface at the time of deposition. A surface that has smudges, or carries even a fine layer of dust or dirt, or that has fingerprints on it, will be deficient in holding the metallic pattern that forms the contact.

It is, therefore, a primary object of the present invention to provide a method of securing a metal contact to the surface of a silicon wafer in which the surface of the wafer will be clean when the metal is applied and a firm adherence established.

This object is accomplished by depositing the conductive metal on the surface of the wafer immediately following the cleaning of the wafer without the intermediation of any intervening steps, other than perhaps rinsing and drying, in the preparation of the surface of the wafer for such deposition. This method, and the product produced thereby, which also forms a part of my invention, are specifically adapted to the formation of a metallic pattern by means of photolithography, although they may also be adapted to other, selective deposition procedures.

In a preferred form, the present invention is embodied in a method in which a junction is diffused into one surface of a silicon wafer to be manufactured into a silicon solar energy cell. Typically, such diffusion will be effected through the use of phosphine or arsine, so that a zone of phosphorus or arsenic is diffused into the silicon and, in the process, a layer, e.g., of phosphor glass is formed on the surface of the silicon wafer. In conventional processes this phosphor glass is removed by etching to expose the silicon surface, to which a metallic pattern is then applied. In my method, the layer of glass is permitted to remain on the surface through additional process steps, thereby protecting the surface of the wafer from fingerprints, dirt, dust and other imperfections that can inhibit proper adherence of the metal contacts.

Contrary to known methods, the photolithographic procedure is initiated with the phosphor glass layer in place on the wafer surface. Thus, a photoresist layer is deposited on the glass layer, the desired pattern exposed photographically onto the photoresist layer, and the pattern developed to remove exposed portions of the photoresist layer. Upon removal of the exposed portions of the photoresist layer, the parts of the phosphor glass layer underlying those portions are now unprotected, and the glass portions are removed by etching down to a fresh, clean silicon surface. Now metal deposition is carried out to bring the metal into contact with the silicon surface, to which it adheres. Then the remainder of the photoresist layer is removed with an organic solvent, and the remainder of the glass layer is next removed by etching. What remains is the conductive metal pattern adhered firmly to the surface of the silicon wafer. The sequence of steps has been such that there has been no appreciable interval between exposure of the clean silicon surface and deposition of metal on that surface.

The above-mentioned and other features and advantages of my invention will become more apparent in view of the following description of a specific embodiment of the best mode of my process and the product that is created as the process is carried out.

That description will be more readily understood when considered in conjunction with the accompanying drawing that forms a part of this application, and in which the sole FIGURE is a flow diagram illustrating the method and the silicon wafer, from its initial form prior to treatment until, by means of my novel method, the wafer is in a form in which its front surface has contacts affixed thereto.

As illustrated, a silicon wafer 10 of a desired size, for example, a circular disc 3 inches in diameter and 10 mils in thickness, is subjected to diffusion with phosphine, oxygen and argon in an oven at a temperature of about 840° C. for 10 to 15 minutes. This diffusion procedure is described in greater detail in my copending application filed this date. The specific manner in which diffusion is accomplished is not essential to the present invention disclosed herein.

By this phosphine-high temperature treatment, phosphorus is diffused into both the front surface 12 and the back surface 12a of the wafer to form junctions 11 and 11a extending inwardly from the front and back surfaces 12 and 12a of the wafer, respectively. Also created by the diffusion process are layers of phosphor glass 13 and 13a, that are contiguous with the surfaces 12 and 12a, respectively. Since in this specific embodiment of the present invention, the purpose is to apply metallic contacts in a pattern on the front surface of the wafer, i.e., the surface 12; therefore, the back of the wafer, including the back surface 12a, its photovoltaic zone 11a and its layer of phosphor glass 13a will not be further illustrated during the additional steps of the present method and product. The application of a back contact is not directly relevant to the invention disclosed and claimed in this application. An improved method of forming such a back contact is described in my copending, concurrently filed application.

Since photolithography will, in this best mode, be utilized to form a pattern for the deposition of metal contacts, a layer of photoresist composition 14 is uniformly applied over the phosphor glass layer 13 and the pattern, shown by three phantom regions 15, is photographed into the photoresist layer. The specific photolithographic process utilized is the so-called Shipley Deposition Process, and a photoresist composition identified as AZ 1350-J and distributed by the Shipley Company, Inc., of Newton, Mass., has been used. It will be obvious, of course, that other photolithographic processes may be utilized in place of the Shipley Deposition Process.

The photoresist layer 14 is then developed, using Shipley developer identified as Azoplate AZ Developer. By such development, the exposed portions 15 of the photoresist layer are removed, leaving void regions 17 corresponding to the contact pattern and extending through the photoresist layer 14 to the phosphor glass layer 13. After a rinse, the wafer is ready for etching. At this time, however, the wafer is in a state in which it can be stored for future use without deleterious effects. The surface 12, to which the contacts are to be applied, is completely protected by the layer 13 of glass, and a layer 14 of photoresist composition covers much of the glass. Consequently, at this stage of the process, gentle handling of the wafer will not damage the front surface 12 of the wafer 10.

After optional storage, the front of the wafer is etched in a known manner using dilute hydrofluoric acid. Such etching removes the glass under the developed regions of the photoresist layer to create enlarged voids 18 extending through the photoresist layer 14 and the phosphor glass layer 13 down to the surface 12 of the wafer. Then, after another water rinse and drying, contact metal which, for example, may be a titanium-silver, titanium-gold or other film, is applied to the entire front surface to fill the voids 18. That application may be made by painting, sputtering, or other known methods. An organic solvent, such as acetone, is then used to remove the photoresist layer and metal on the layer, resulting in a wafer in the form illustrated in the penultimate view, in which the metal contacts 19 cover part of the surface 12, the remainder of which is covered by phosphor glass.

Finally, the front of the wafer is again subjected to dilute HF, as by dipping, to remove the phosphor glass in its entirety. Now the silicon wafer has a front surface 12 on which metal contacts 19 have been applied in a predetermined pattern and which are firmly adhered to that surface, since the surface was fresh and clean immediately prior to metal deposition. Adjoining the front surface 12 is a zone 11 in which phosphorus has penetrated the silicon to form a front junction. When the front surface of the cell has been further treated, if desired, and a back junction has been formed and a back contact applied, an operative, photovoltaic cell has been formed.

It will be apparent that reference has been made herein to a specific embodiment of my invention for the purpose of illustration only, and that alterations and modifications of the process and product therein described will be obvious to those of skill in this art. It is desired, therefore, that all such alterations and modifications be considered within the purview of my invention, which is to be limited only by the scope, including equivalents, of the following, appended claims.

I claim:

1. A method of forming a contact pattern on a silicon wafer to be used as a solar energy cell, comprising
    (a) heating a wafer of silicon with a dffusant to for a p-n junction in a zone extending inwardly from a surface of the wafer and a layer of a glass on the surface of the wafer,
    (b) coating the glass on the surface with a layer of photoresist composition,
    (c) photographically exposing the photoresist layer in a predetermined pattern,
    (d) developing the photoresist layer and thereby removing the exposed portions of the layer,
    (e) removing those portions of the glass layer underlying the developed portions of the photoresist layer down to the silicon surface of the wafer,
    (f) depositing an electrically conductive metal on the exposed portions of the silicon surface to act as contacts in the solar energy cell while the remainder of the wafer surface is protected and covered by undeveloped portions of the photoresist layer and portions of the glass layer underlying said undeveloped portions,
    (g) removing the remainder of the photoresist layer, and
    (h) removing the entirety of the glass from the surface of the wafer thereby leaving a metal contact adhered to said surface in a predetermined pattern, said surface and said metal contact being free of said glass, and exposing non-contact covered portions of said surface to ambient conditions only after said contact pattern has been adhered to said surface.

2. A method as claimed in claim 1, in which the diffusent is a phosphorus compound and the glass is a phosphor glass.

* * * * *